(12) United States Patent
Chen et al.

(10) Patent No.: US 6,760,225 B1
(45) Date of Patent: Jul. 6, 2004

(54) HEAT-DISSIPATING STRUCTURE OF CIRCUIT BOARD

(75) Inventors: Lien-Hing Chen, Taichung (TW); Aaron Tsai, Taichung (TW); Daven Chang, Taichung (TW)

(73) Assignee: Power Mate Technology Co., Ltd., Taichung (TW)

( * ) Notice: Subject to any disclaimer, the term of this patent is extended or adjusted under 35 U.S.C. 154(b) by 0 days.

(21) Appl. No.: 10/395,165

(22) Filed: Mar. 25, 2003

(30) Foreign Application Priority Data

Jan. 20, 2003 (TW) .................................... 92200953 U

(51) Int. Cl.[7] .................................................. H05K 7/20
(52) U.S. Cl. ...................... 361/719; 361/704; 361/707; 361/720; 361/760; 174/252
(58) Field of Search ...................... 361/704, 714–719, 361/748, 760–762, 764–768; 257/706, 707; 174/252; 165/80.3, 185

(56) References Cited

U.S. PATENT DOCUMENTS

| | | | | |
|---|---|---|---|---|
| 5,384,683 A | * | 1/1995 | Tsunoda ..................... 361/313 |
| 5,552,637 A | * | 9/1996 | Yamagata ................... 257/717 |
| 5,708,566 A | * | 1/1998 | Hunninghaus et al. ...... 361/704 |
| 5,721,455 A | * | 2/1998 | Takashita .................... 257/713 |
| 5,796,582 A | * | 8/1998 | Katchmar .................... 361/704 |
| 5,811,736 A | * | 9/1998 | Lauffer et al. .............. 174/263 |
| 6,175,084 B1 | * | 1/2001 | Saitoh et al. ............... 174/252 |
| 6,226,183 B1 | * | 5/2001 | Weber et al. ............... 361/704 |
| 6,252,179 B1 | * | 6/2001 | Lauffer et al. .............. 174/263 |
| 6,373,705 B1 | * | 4/2002 | Koelle et al. ............... 361/720 |
| 6,449,158 B1 | * | 9/2002 | Wang et al. ................ 361/704 |
| 6,477,054 B1 | * | 11/2002 | Hagerup ..................... 361/720 |

* cited by examiner

Primary Examiner—Boris Chervinsky
(74) Attorney, Agent, or Firm—Bacon & Thomas

(57) ABSTRACT

A heat-dissipating circuit board assembly is composed of a heat-conducting base board and a circuit board. The heat-conducting base board includes an insulating heat-conducting layer disposed thereon and a plurality of bonding pads disposed on the insulating heat-conducting layer and never connected with one another. The circuit board that is single-layered or multiple-layered includes a plurality of electronic components at at least one side thereof and a plurality of heat-dissipating zones at a side thereof. The heat-dissipating zones are connected with heat-generating elements of the electronic components and in a corresponding position to the bonding pads. The heat-conducting base board is connected with the heat-conducting base board by the melted bonding pads that are melted by heating and further disposed therebetween.

5 Claims, 5 Drawing Sheets

HEAT-DISSIPATING STRUCTURE OF CIRCUIT BOARD

BACKGROUND OF THE INVENTION

1. Field of the Invention

The present invention relates generally to electronic parts, and more particularly to an improved heat-dissipating circuit board assembly.

2. Description of the Related Art

A conventional heat-dissipating circuit board assembly is composed of a circuit board and an aluminum board adhered to a bottom side of the circuit board. The aluminum board is disposed with an insulating heat-conducting layer coated on a surface thereof and is adhered to the bottom side of the circuit board by hot pressing in a vacuum machine. The insulating heat-conducting layer not only prevents electrical contacts positioned on the bottom side of the circuit board from short circuit, but also conducts heat generated by heat-generating components of the circuit board to the aluminum board, which dissipates the heat outwards.

However, the aforementioned heat-dissipating circuit board assembly has following drawbacks.

1. The insulating heat-conducting layer is less heat-conductive than metal and has poor tightness and binding strength.
2. The hot-pressing that makes the aluminum board disposed on the circuit board under the vacuum condition is high in production cost but low in yield.

SUMMARY OF THE INVENTION

The primary objective of the present invention is to provide a heat-dissipating circuit board assembly, which is effective in heat-dissipation.

The secondary objective of the present invention is to provide a heat-dissipating circuit board assembly, which is low in production cost but high in yield.

The foregoing objectives of the present invention are attained by the heat-dissipating circuit board assembly, which is composed of a heat-conducting base board and a circuit board. The heat-conducting board includes an insulating heat-conducting layer disposed thereon and a plurality of bonding pads disposed on the insulating heat-conducting layer and never connected with one another. The circuit board that is single-layered or multiple-layered includes a plurality of electronic components at at least one side thereof and a plurality of heat-dissipating zones at a side thereof. The heat-dissipating zones are connected with heat-generating elements of the electronic components and correspond to the bonding pads. The heat-conducting base board is connected with the circuit board by the bonding pads that are melted by heating and further disposed therebetween.

DETAILED DESCRIPTION OF THE INVENTION

Figure 1:
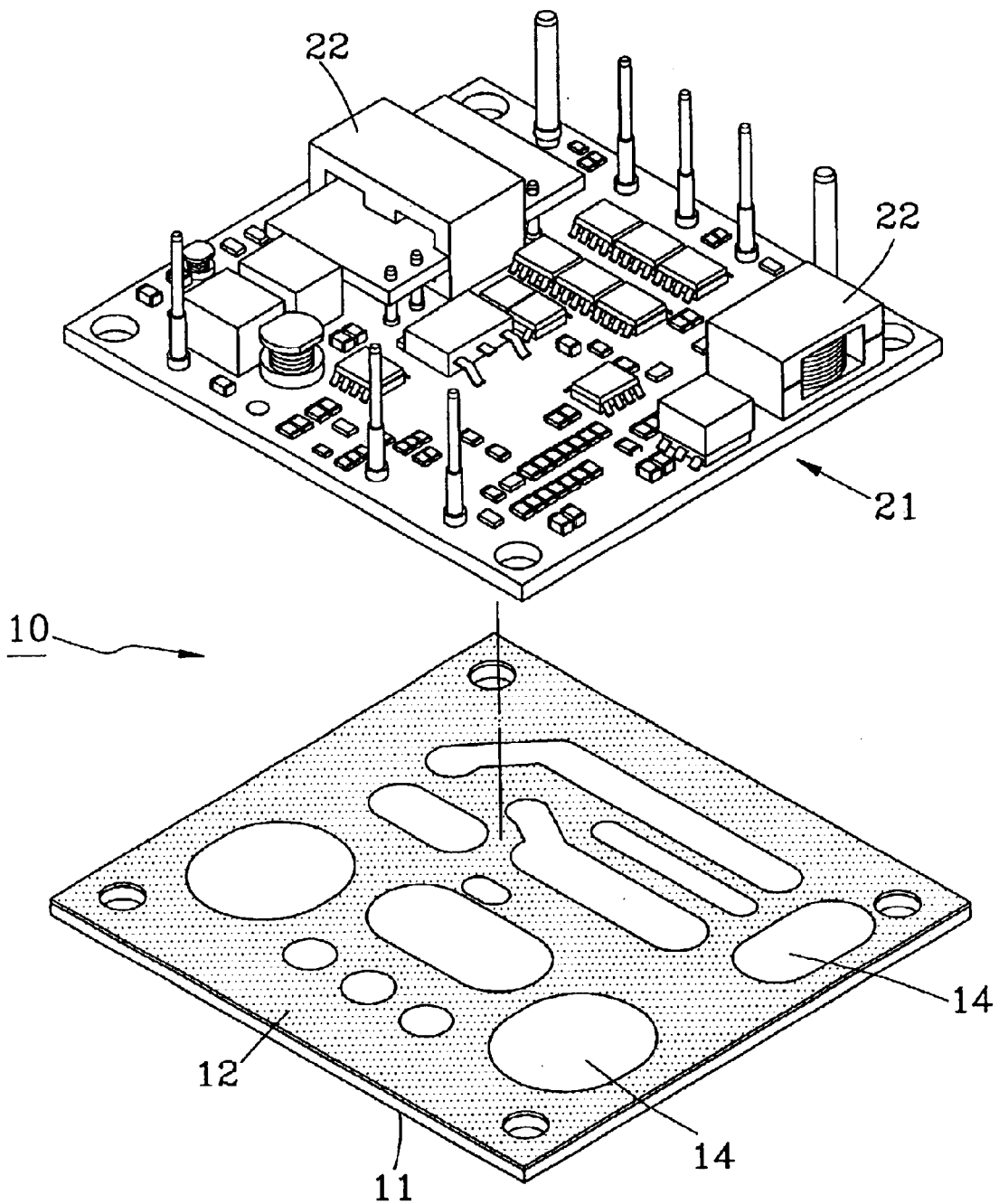
FIG. 1 is an exploded view of a first preferred embodiment of the present invention.
Figure 2:
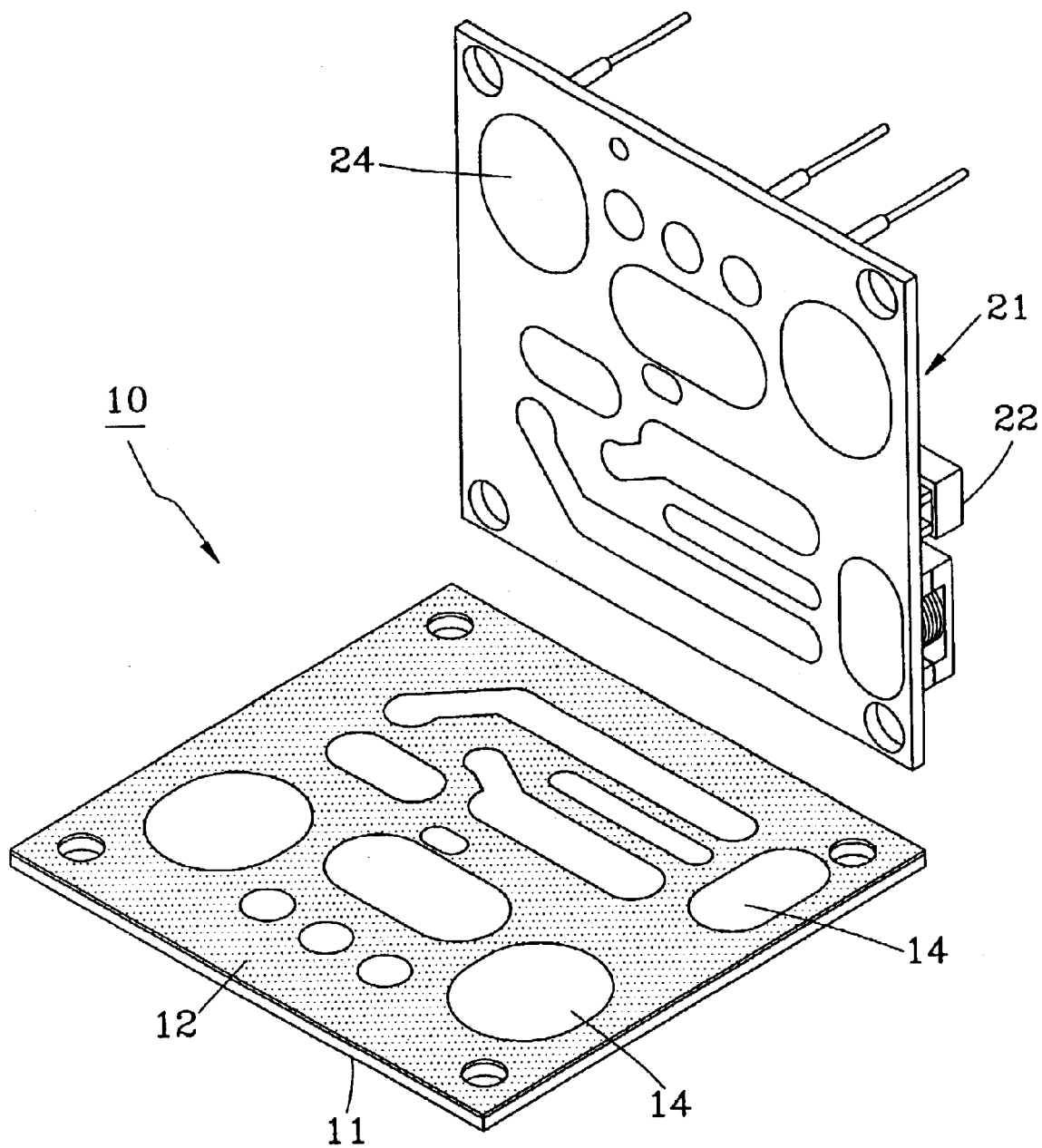
FIG. 2 is an exploded view of the first preferred embodiment of the present invention, showing a bottom side of a circuit board.
Figure 3:
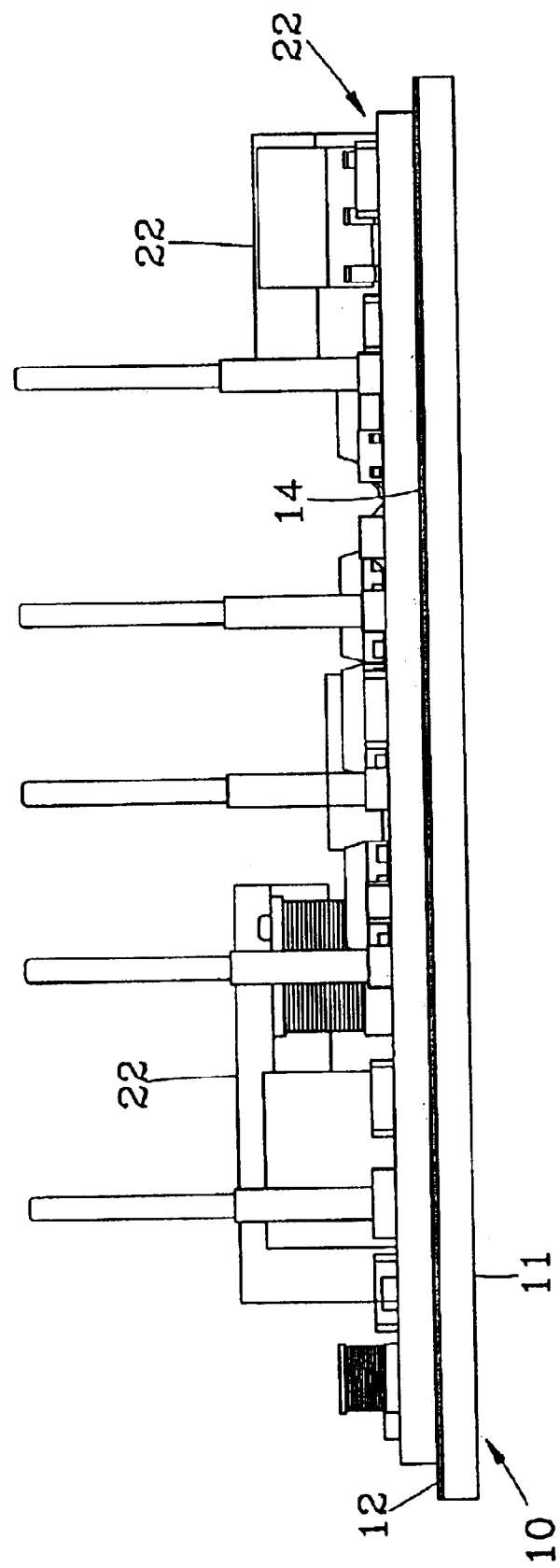
FIG. 3 is a side view of the first preferred embodiment of the present invention.

Referring to FIGS. 1–3, a heat-dissipating circuit board assembly 10 of a first preferred embodiment of the present invention is composed of a heat-conducting base board 11 and a circuit board 21.

The heat-conducting base board 11 that is embodied as an aluminum board is disposed with an insulating heat-conducting layer 12 thereon, which is very thin and has a thickness of substantially 6 milliliter. The bonding pads 14 that are embodied as tin films are disposed on the insulating heat-conducting layer 12 by screen printing and never connected with one another.

The circuit board 21 that is single-layered or multiple-layered includes a plurality of electronic components 22 at a side thereof and a plurality of heat-dissipating zones 24 formed of copper plates at the other side thereof. The heat-dissipating zones are connected with heat-generating elements of the electronic components 22. The bonding pads 14 are positioned corresponding to the heat-dissipating zones 24.

The heat-conducting base board 11 and the circuit board 21 are connected with each other by the bonding pads 14 that are melted by heating and are positioned therebetween.

While the present invention is manufactured, the circuit board 21 is positioned on the heat-conducting base board 11 such that the heat-dissipating zones 24 respectively correspond to the bonding pads 14. And then, pass the aforementioned assembly through a SMT (surface mount technology) production line, like a soldering furnace, to melt the bonding pads 14 and to further connect the circuit board 21 and the heat-conducting board 11 together.

Figure 4:
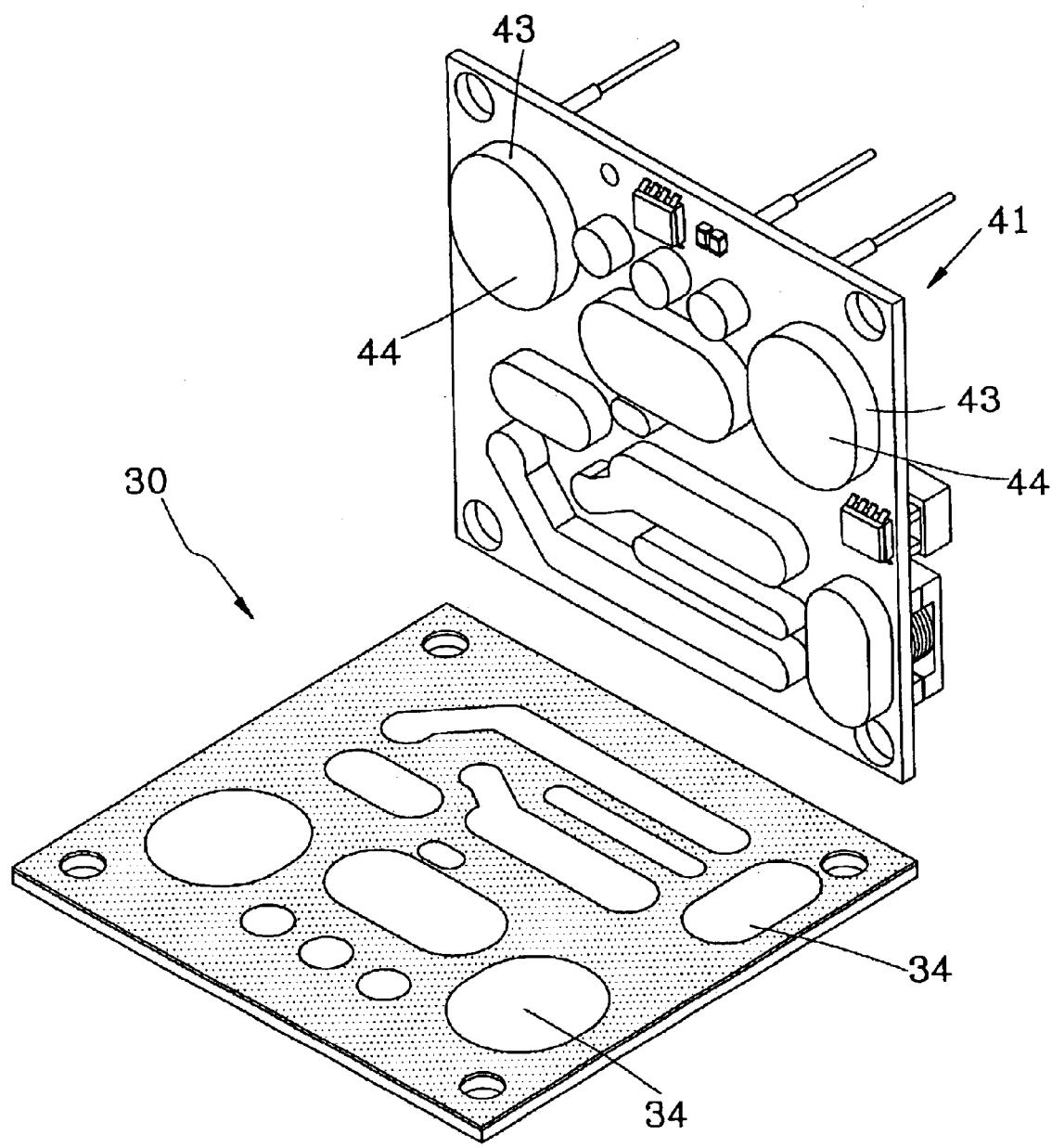
FIG. 4 is an exploded view of a second preferred embodiment of the present invention, showing the bottom side of the circuit board.

Referring to FIG. 4, the heat-dissipating circuit board assembly 30 of a second preferred embodiment of the present invention differs from the first preferred embodiment in that the circuit board 41 is further disposed with a plurality of heat-generating electronic components 43 at the bottom side thereof. The heat-generating electronic components 43 are provided with the same height and planar heat-dissipating zones 44 at a top side thereof in a corresponding position to the bonding pads 34.

Figure 5:
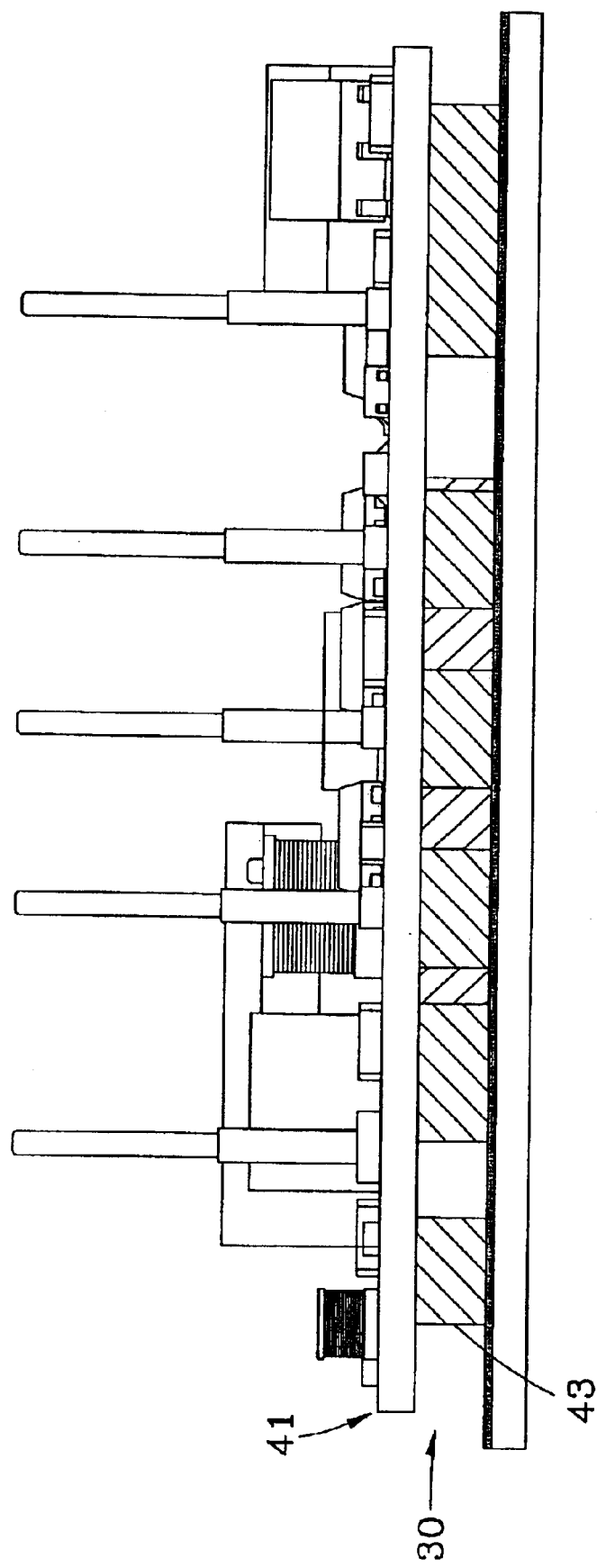
FIG. 5 is a side view of the second preferred embodiment of the present invention.

Referring to FIG. 5, after the heat-dissipating circuit board assembly 30 is processed, the heat-dissipating zones 44 of the heat-generating electronic components 43 are fixedly connected with the melted bonding pads 34. In the meantime, the heat-generating electronic components 43 are formed of a plurality of gaps between one another such that the gaps are formed to be air passages that functioned as the heat-dissipation zones 44 and makes the heat-dissipating circuit board assembly 30 more heat-dissipation effective than in the first preferred embodiment.

In a conclusion, the present invention includes following advantages:

1. Heat generated by the heat-generating elements is conducted through the bonding pads 14 to the insulating heat-conducting layer 12 such that the insulating heat-conducting layer 12 is effectively enhanced in heat-dissipation and then more effective heat-dissipation of the present invention than the prior art is achieved.
2. In addition to heat-dissipation, the bonding pads 14 can further interconnect the heat-conducting base board 11 and the circuit board 21 tight with each other.

3. The bonding pads 14 can be a part of the whole circuits of the circuit board and have large size so as to provide low resistance especially for huge current.

4. It's easy to manufacture the present invention by that positing the circuit board on the heat-conducting base board and then through a tin furnace, thereby causing low production cost and making no damage to components of the present invention.

What is claimed is:

1. A heat-dissipating circuit board assembly comprising:

a heat-conducting base board having an insulating heat-conducting layer disposed thereon and a plurality of bonding pads disposed on said insulating heat conducting layer, said bonding pads being never connected with one another; and a circuit board having a plurality of electronic components at at least one side thereof and a plurality of electrically conducting metallic heat-dissipating zones at a side thereof, said heat-dissipating zones being connected with heat-generating elements of said electronic components, said bonding pads corresponding to said heat-dissipating zones; wherein said heat-conducting base board and said circuit board are connected with each other by said bonding pads that are melted by heating and are further disposed therebetween.

2. The heat-dissipating circuit board assembly as defined in claim 1, wherein said circuit board includes a plurality of electronic components at a side thereof and a plurality of heat-generating electronic components, said heat-generating electronic components having the same height and planar heat-dissipating zones at top sides thereof, said heat-dissipating zones corresponding to said bonding pads.

3. The heat-dissipating circuit board assembly as defined in claim 1, wherein said bonding pads are tin films disposed on said insulating heat-conducting layer by screen printing.

4. The heat-dissipating circuit board assembly as defined in claim 1, wherein said heat-conducting base board is made of aluminum.

5. The heat-dissipating circuit board assembly as defined in claim 1, wherein said heat-conducting base board is made of ceramic.

\* \* \* \* \*